United States Patent [19]
Burns

[11] Patent Number: 5,578,935
[45] Date of Patent: Nov. 26, 1996

[54] UNDERSAMPLING DIGITIZER WITH A SAMPLING CIRCUIT POSITIONED ON AN INTEGRATED CIRCUIT

[75] Inventor: Mark A. Burns, Garland, Tex.

[73] Assignee: Texas Instruments Incorporated, Dallas, Tex.

[21] Appl. No.: 452,623

[22] Filed: May 25, 1995

[51] Int. Cl.$^6$ ............................................. G01R 31/28
[52] U.S. Cl. ................................... 324/763; 324/121 R
[58] Field of Search .......................... 324/763, 121 R, 324/158.1; 364/487; 371/22.5, 22.6

[56]  References Cited

U.S. PATENT DOCUMENTS

| | | | |
|---|---|---|---|
| 3,836,851 | 9/1974 | Schumann | 324/121 R |
| 4,142,146 | 2/1979 | Schumann et al. | 324/121 R |
| 4,194,185 | 3/1980 | Wilson | 364/487 |
| 4,346,333 | 8/1982 | Dagostino | 324/121 R |
| 4,641,246 | 2/1987 | Halbert et al. | 324/121 R |
| 4,654,584 | 3/1987 | Gyles | 364/487 |
| 5,122,800 | 6/1992 | Philipp | 364/487 |
| 5,212,485 | 5/1993 | Shank et al. | 324/121 R |
| 5,436,558 | 7/1995 | Saitoh et al. | 324/763 |

Primary Examiner—Ernest F. Karlsen
Attorney, Agent, or Firm—W. Daniel Swayze, Jr.; W. James Brady, III; Richard L. Donaldson

[57]  ABSTRACT

An apparatus measures a repetitive signal, including a signal generating circuit to output the repetitive signal in accordance with first clock signals which are generated by a first clock circuit. A sampling circuit samples the repetitive signal in accordance with strobe signals to output sampled signals, the strobe signals are output by a strobe generator circuit. An output circuit stores the sampled signals and outputs a reconstructed signal based on said sampled repetitive signal.

8 Claims, 2 Drawing Sheets

5,578,935

UNDERSAMPLING DIGITIZER WITH A SAMPLING CIRCUIT POSITIONED ON AN INTEGRATED CIRCUIT

TECHNICAL FIELD OF THE INVENTION

This invention relates to electronic test and measurement equipment and, more particularly, to the field of automated test equipment (ATE) and integrated circuit design-for-test (IC DFT).

BACKGROUND OF THE INVENTION

Previously, Automated Test Equipment have attempted to measure high frequency signals, but the accurate measurement of these high frequency signals has proven difficult. The results of the measurements are often unsatisfactory. One reason for the difficulty is related to the parasitic effects of the hardware fixturing of the ATE equipment. Stray capacitance and inductance from the fixturing such as wafer probes, handler contactors and device sockets may have a detrimental effect on the high frequency electrical signals to be measured. Exemplary, the settling time of a palette digital to analog converter (DAC) could be difficult to accurately measure through a long wire since the inductance of this long wire would adversely affect the signal to be measured.

Matched impedance terminated coaxial cables have been used successfully in these ATE test fixtures to reduce the inductive and capacitive effects of the signal transmission path of the cables. A properly terminated coaxial cable appears as a purely resistive load to the device under test (DUT). Such terminated cables can be successfully used to measure a signal if the device under test (DUT) is capable of driving the termination resistance without significantly affecting the signal under test. Typical ATE coaxial cables may require a termination resistance of either fifty or ninety Ohms and as such require the DUT to drive a fifty or ninety Ohm resistive load. Many devices under test do not have such low impedance drive capability and as a consequence the ATE equipment cannot easily be used to measure high frequency electrical signals.

Measurements of these high frequency signals are also affected adversely by the limited speed of the A/D converters of the prior art. These prior art converters are adapted to operate at higher sampling rates which disadvantageously limits their voltage resolution. Exemplary, if a converter operates at a required sampling rate of 20 MHZ, the digitizer of the converter may have a resolution of only 12 bits instead of the preferred 16 to 24 bits common to lower frequency converters.

In certain prior art high speed digitizers, the stray inductance/capacitance and sampling resolution problems have been reduced by positioning a very high speed strobed comparator near the device under test (DUT). This comparator is used as a front-end to an undersampling successive approximation routine (SAR) A/D converter. Positioning the comparator near to the DUT may reduce the effects of the stray capacitance and inductance on the signal to be tested. However, there is a physical limit to how close the comparator can be positioned near to the DUT. When the comparator is positioned on an integrated circuit chip (IC) separated from the circuit under test, this separation of the two IC's imposes limits to how close the devices may be positioned together. As a consequence of this limitation, the separation prevents this elimination of additional stray capacitance and inductance.

SUMMARY OF THE INVENTION

The present invention provides an apparatus including test equipment that minimizes the effect of stray capacitance and inductance on a signal under test by positioning a comparator on the same integrated circuit chip as the circuit under test. By this arrangement, the stray capacitance and inductance is minimized if not eliminated.

The present invention includes an apparatus for measuring a repetitive signal, including a signal generating circuit to output said repetitive signal in accordance with clock signals, a clock circuit coupled to a generating circuit to output said clock signals, a circuit under test to receive the repeated signal and to output a test signal, a timing generator to provide undersampling strobe signals, a strobed comparator circuit to instantaneously compare the test signal with a successive approximation voltage in accordance with the undersampling strobe signals and to output a series of one-bit comparison results, said circuit under test and said strobed comparator circuit being positioned on a single integrated circuit, a digital or analog signal processor to provide said successive approximation reference voltage to said strobed comparator in accordance with said one-bit comparison results, and a waveform capture circuit to store and output a reconstructed signal based on the successive approximation results.

DETAILED DESCRIPTION OF THE DRAWINGS

Additional features of the invention will be more readily apparent from the following detailed description and appended claims when taken in conjunction with the drawings in which:

DETAILED DESCRIPTION OF THE INVENTION

Figure 1:
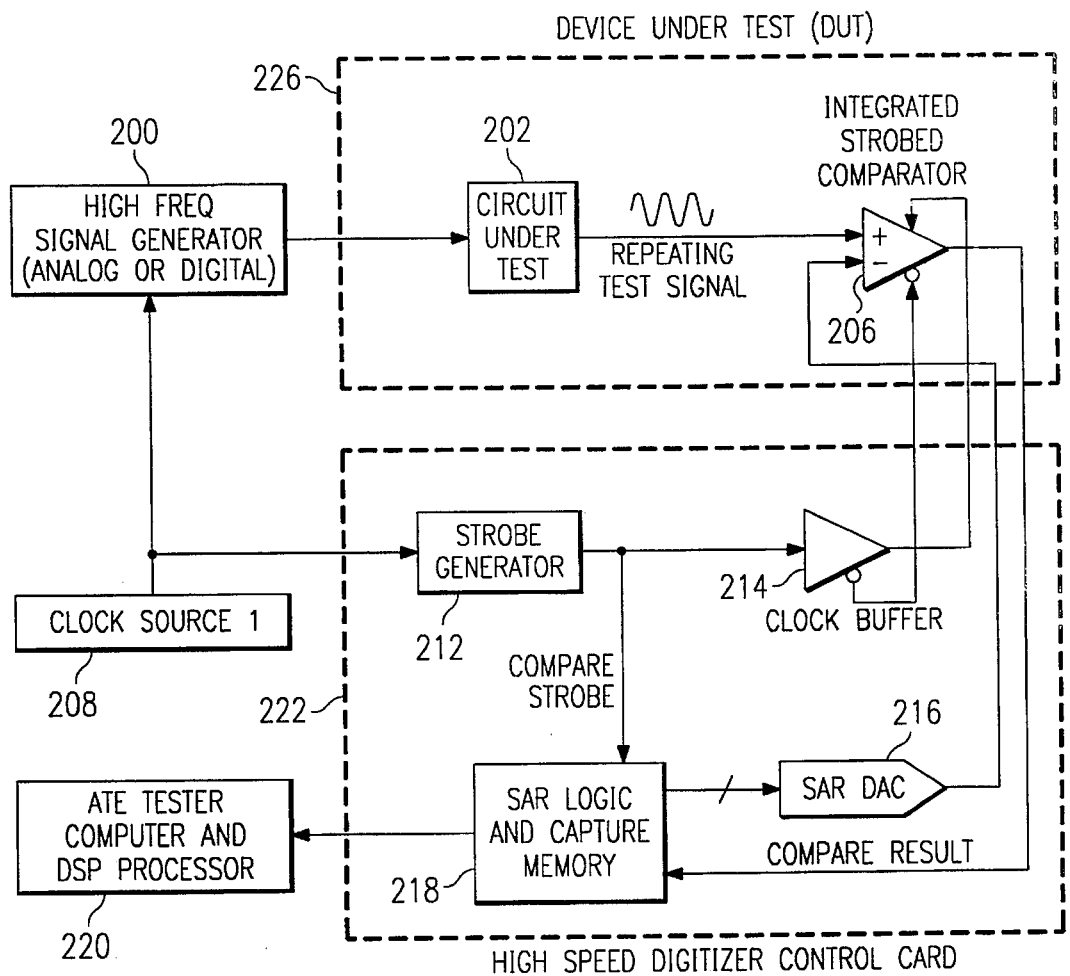
FIG. 1 illustrates a digitizer with a comparator positioned on the same integrated circuit as the circuit under test.

FIG. 1 illustrates a digitizer including a clock source 208, a high frequency signal generator 200 to output a periodic waveform, an ATE tester computer and DSP processor 220, a high speed digitizer control card 222 and a device under test 226, which is to be tested. The high speed digitizer control card 222 includes a SAR logic and capture memory 218, a SAR DAC 216 and a strobe buffer 214. The clock source 208 outputs clock pulses at a predetermined frequency. The strobe generator 212 and strobe buffer 214 generate strobe pulses which control the sample times or intervals of an integrated strobed comparator 206 positioned on the same integrated circuit as the circuit under test 202. Since the circuit under test 202 is on the same chip as comparator 206, stray capacitance and inductance is minimized or eliminated because the physical distance between circuit under test 202 and comparator 206 is very small or eliminated. Thus, the repeating test signal is unaffected by stray capacitance or inductance. Successive approximation routine (SAR) logic of the SAR logic and capture memory 218 controls an analog integrator or SAR DAC 216, which in turn provides a comparison voltage to an input of the strobed comparator 206. The SAR logic and memory circuit 218 is coupled to both the ATE tester computer and DSP processor 220 and to the SAR digital analog converter circuit SAR DAC 216. The SAR logic and memory 218, which may be VLSI digital logic, computer, mini computer, microcomputer or a personal computer, all having a memory, outputs samples obtained from the successive approximation process to the ATE tester computer and DSP processor 220 for further testing and processing. The SAR logic and memory 218 controls the SAR DAC 216 to output an initial signal for comparison with the repeating test signal by comparator 206. The output of the comparator 206 may be stored in the memory of the SAR logic and capture memory 218. This output is used to control the SAR DAC 216 to output a signal from SAR DAC 216 for comparator 206 based on the initial signal from SAR logic and memory 218 and the output of the comparator 206.

In operation, the dock circuit 208 outputs first clock pulses to the high frequency signal generator circuit 200, which in turn outputs a repetitive waveform which may be at a high frequency or in the alternative a repetitive digital pattern to the circuit under test 202, exemplary a high frequency waveform in accordance with the output dock pulses. The circuit under test 202 outputs a repeating test signal to the comparator 206.

The clock circuit 208 determines the repetition frequency $F_{UTP}$ of the repetitive waveform being input to the circuit under test 202. The strobe generator 212 and strobe buffer 214, which inputs the dock pulses output from the dock circuit 208, controls the sampling intervals of the comparator to sample the output of the circuit under test 202. To digitize a predetermined point of time on the repeating test signal at the output of the circuit under test 202, the sampling times which define a strobe interval of the strobed comparator 206 are set to coincide with a fixed point in the repeating waveform. Exemplary, the sampling times may be separated by a time interval equal to N $F_{UTP}$ where N is any positive non-zero integer. At each strobe interval, the comparator 206 compares the instantaneous voltage level of the repeating test signal with the output of the SAR DAC 216 or alternatively an analog integrator. The SAR logic and capture memory 218 then outputs a signal sufficient to result in the successive approximation voltage at the output of the analog integrator or SAR DAC 216 to either increase or decrease, depending on the strobed output from comparator 206. Exemplary, if the output of the comparator 206 is a logic "1" then the output of the SAR DAC 216 may be increased and if the output is a logic "0" then the output of the SAR DAC 216 may be decreased. The successive approximation process of the SAR DAC 216 may be either a binary voltage search, whereby the output of the SAR DAC 216 is successively adjusted in binarily weighted voltage steps of decreasing magnitude. Alternatively, the one or more integrators (not shown) may be used to output an integrated signal instead of the SAR DAC 216 to integrate up or down to effect each successive approximation step. After the successive approximation process has been repeated a sufficient number of times, the voltage at the output of the SAR DAC 216 should be approximately equal to the repeating test signal's instantaneous voltage at the strobed sample time. The output of the SAR DAC 216 may be digitized with a conventional analog to digital converter to output a digitized sample which is stored in a SAR logic and capture memory 218. Alternatively, the digital control signal from the SAR logic 218 may be stored directly to the SAR logic and capture memory 218, provided there is a known relationship between the digital control value and the output of the SAR DAC 216.

After each sample point on the repeating waveform is digitized in the above manner, another point may be digitized by changing the position of the comparator strobe pulses relative to the repeating signal under test and repeating the single point digitization process. By sampling and storing instantaneous voltage points at evenly spaced intervals, a digitized representation of the repeating signal under test may be captured and stored in the memory of the SAR logic and capture memory 218.

Since each sample may be digitized at a rate less than twice the highest frequency component in the repeating test signal, the sampling process of the invention may be utilized with an apparatus employing an undersampling digitization process. However, the invention can also be used to digitize certain low frequency or DC test signals, provided the sample intervals are spaced closely enough that the test signal does not change significantly between the successive approximations of any given sample.

Figure 2:
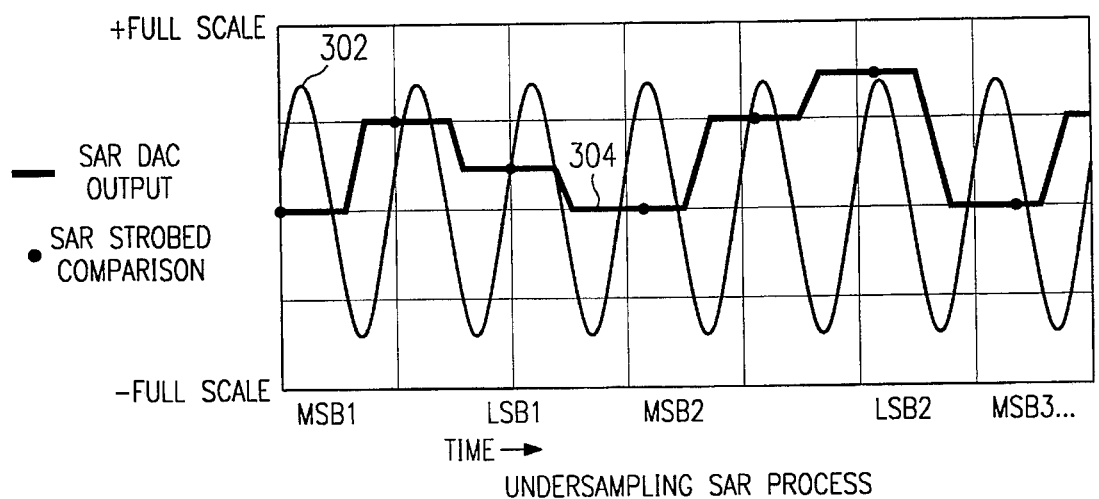
FIG. 2 illustrates the repeating test input, strobe timing, and SAR DAC output of an undersampling SAR A/D circuit.

FIG. 2 illustrates the conversion of a sine wave 302 to obtain a three-bit, binary weighted, undersampled analog to digital A/D which has been input to the integrated comparator 206. The output signal 304 of the SAR DAC which has been placed initially at its mid-scale voltage. At time =0, the one-bit result of a strobed comparison between the SAR DAC output voltage and the input sine wave 302 by comparator 206 is stored within the SAR logic and capture memory of FIG. 1. This bit is stored to the most significant bit (MSB) of the first digitized sample into the memory of SAR logic and capture memory 218. At a predetermined time after the capture of the first MSB, the output of the SAR DAC 216 is raised to ½ full scale or lowered to −½ full scale, depending on the value of the previously determined MSB. At the first increment of time, the process is repeated to obtain another strobed comparison between the output of the SAR DAC 216 and the input sine wave 302. Again, this second comparison result is stored in the memory of the SAR logic and capture memory 216 of FIG. 1, along with the previously captured MSB. After the first increment of time, the output of the SAR DAC 216 is again adjusted to reflect the first and second comparison results, continuing the successive approximation process in a binary search. At the second increment of time, the least significant bit of the first sample is obtained with a third strobed comparison and the output of the SAR DAC 216 is returned to its mid-scale voltage. This completes the collection of the data for the first sample and the process is subsequently repeated for the second sample and the third sample, respectively. The strobed comparisons for each three-bit sample are taken at the same voltage point on the repeating input waveform. To sample different points on the input waveform, the strobed comparison timing for each three-bit sample should be offset from the strobe timing of the previous sample by a small time slip. The magnitude of time slip controls the high speed digitizer's effective sampling rate. Exemplary, a 100 ps time slip corresponds to a 10 GHz effective sampling rate. Although, FIG. 2 illustrates that the comparisons for each digitized sample are taken once for each repetition period of the waveform 302, comparisons from the comparator 206 may be separated by any integer multiple of the repetition period of the waveform being input to allow more settling time for the output of the SAR DAC 216.

Figure 3:
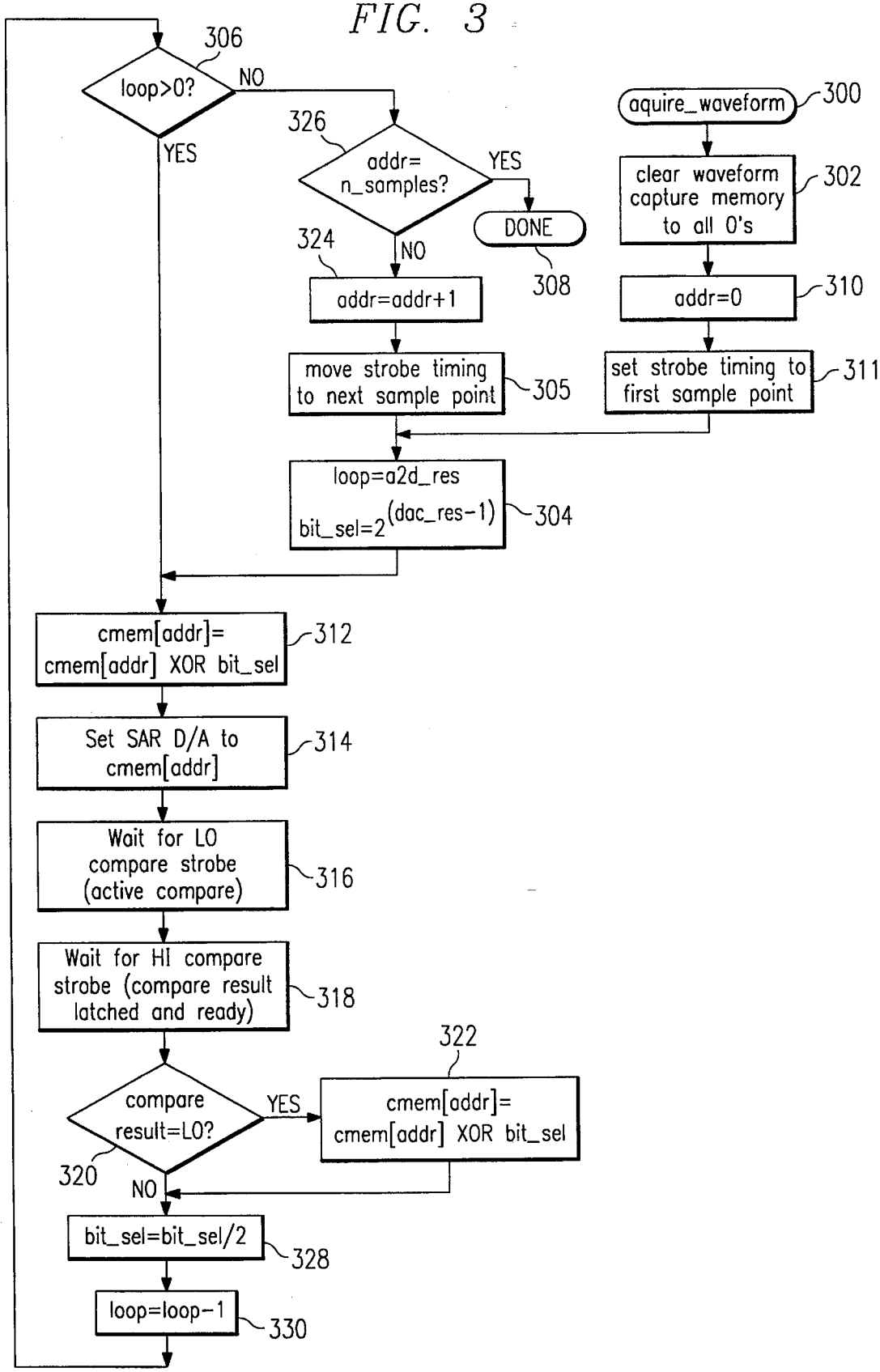
FIG. 3 illustrates a flow chart of a binary weighted successive approximation process.

FIG. 3 illustrates a flow chart of the SAR process of the present invention. The SAR logic and capture memory 218 may be VLSI digital logic, a microprocessor, a computer, a mini-computer or a micro-computer, etc. Additionally, the SAR logic and capture memory circuit 218 may be distributed over a network. Referring now to FIG. 3, block 300 illustrates that a command to acquire the waveform is received by the SAR logic and memory circuit 218. The desired converter resolution, R, and the desired number of samples, S, are determined prior to the start of digitization. In block 302, the waveform capture memory of the SAR logic and capture memory circuit 218 is cleared, for example, to all zeros. The capture address memory pointer is set to zero in block 310. In block 311, the strobed sample is set to the first sample point. In block 304, the loop counter is set to the desired digitizer resolution. The SAR bit selection value is set to $2^{(SAR\ DAC\ resolution\ -1)}$ or, equivalently, to binary 1 shifted left by (SAR DAC resolution −1) binary positions. Exemplary, if the SAR DAC 216 has a resolution of 8 bits, the bit selection value would be initially set to binary 10000000 to select the most significant bit of the SAR DAC 216. In block 312 the waveform capture memory storage element spedfled by the capture memory pointer is exclusively ored (XOR) to the SAR bit selection value. In block 314, the SAR digital to analog converter 216 is set to the value contained in the capture memory storage element specified by the capture memory pointer. Exemplary, the value 0000 . . . 000 corresponds to minus full scale of the SAR digital to analog converter 216, 1111 . . . 111 corresponds to plus full scale, and 1000 . . . 000 corresponds to mid-scale. In block 316, the processor and memory circuit 218 waits for a "low" compare strobe to indicate an active compare. In block 318, the processor and memory 218 waits for a "high" compare strobe indicating that the compare result is latched and ready. In decision block 320, the compare result logic state is examined. If the result is LO (logic 0), in block 322, the waveform capture storage element specified by the capture memory address pointer is exclusively ored (XOR) with the SAR bit selection value. If the result from decision block 320 is HI (logic 1), or after decision block 322 has been executed, the SAR bit selection value is divided in half in block 328. In block 330, the loop counter is decremented by one. Control is transferred to decision block 306. In decision block 306, it is determined if the loop counter is greater than zero. If the loop counter is greater than zero, then block 312 is executed. If it is not, then in decision block 326, the capture memory address pointer is compared with the desired number of samples, S. If the desired number of samples has not been reached, then in block 324 the capture memory address pointer is incremented by one and control is passed to block 305. In block 305, the strobed sample timing is positioned to the next sample point on the repeating waveform. If the capture memory address pointer equals the desired number of samples, S, the waveform capture memory array contains the complete digitized waveform, as illustrated in block 308.

The SAR logic and capture memory 218 may be coupled to either an ATE tester computer or a DSP processor or both 220, and to the SAR DAC 216. After all bits of each sample have been collected, the SAR logic and capture memory 218 may output the contents of the waveform capture memory to the ATE tester computer and DSP processor 220 for further testing and processing. Alternatively, the SAR logic and capture memory 218 may perform further processing on the collected waveform before transferring the processed waveform to the ATE computer and/or DSP processor 220. The SAR logic and capture memory 218 may instead reconstruct the captured waveform at a lower sampling rate using the SAR DAC 216 or another DAC, not shown. This reconstructed signal, representing a lower frequency image of the original high frequency test signal, could be directly viewed using an oscilloscope or other display device, or it could be resampled by a prior art low frequency digitizer.

Other embodiments of this invention are within the scope of the invention. The SAR DAC 216 can be replaced by a 2's complement digital to analog converter, for which 0111 . . . 111 corresponds to plus full scale, 1000 . . . 000 corresponds to minus full scale, and 0000 . . . 000 corresponds to mid-scale. To implement this embodiment, a modification of the SAR logic/flowchart of FIG. 3 would be needed to include the different encoding scheme of the 2's complement DAC.

A second alternative embodiment may use one or more cascaded analog integrators in place of the SAR DAC 216, forming an undersampling delta modulator. The output of the integrator or integrators would be caused to increase or decrease to match the instantaneous voltage of the repeating test signal at each strobe interval.

The strobed comparator 206 can have either a differential strobe input, as shown, or a single-ended strobe input (not shown). Differential strobe inputs are common in high speed strobed comparators because they reduce strobe time jitter introduced by ground bounce and other forms of interference on the strobe signal. However, a single-ended strobe input could be used as long as timing of the strobe could be well controlled.

What is claimed is:

1. An apparatus for measuring a repetitive test waveform, comprising:

a signal generating circuit to output said repetitive test waveform in accordance with clock signals;

a clock circuit coupled to said signal generating circuit to output said clock signals;

a circuit under test on an integrated circuit to input said repetitive test waveform and to output a repeating test signal;

a strobed comparator positioned on the same integrated circuit as the circuit under test, said strobed comparator sampling the repeating test signal in accordance with sampling point strobe signals and a comparison level signal and to output a comparison signal;

a strobe generating circuit coupled to sampling circuit to output said sampling point strobe signals, and forming sampling point strobe intervals spaced across said repetitive test waveform;

a successive approximation digital to analog converter providing the comparison level signal for said strobed comparator;

said processor to provide successive approximation values to said successive approximation routine digital to analog converter;

waveform capture memory to store said comparison level signals for subsequent retrieval, said waveform capture memory and successive approximation routine logic collecting one bit at a time from each digitized sample, resulting in a digitized waveform corresponding to said repetitive test waveform.

2. An apparatus for measuring a repetitive signal as in claim 1, wherein said repetitive test waveform is a digital signal.

3. An apparatus for measuring a repetitive signal as in claim 1 or 2, wherein an output circuit outputs said digitized waveform to a host computer, digital signal processor, or waveform display device.

4. An apparatus for measuring a repetitive signal as in claim 1 or 2 wherein said processor, capture memory, first clock circuit, strobe generating circuit, and/or signal generating circuit are placed on the same integrated circuit as said circuit under test and said strobed comparator.

5. An apparatus for measuring a repetitive signal as in claim 1 or 2 in which said strobed comparator includes a differential strobe input.

6. An apparatus for measuring a repetitive signal as in claim 1 or 2 in which said strobed comparator includes a single-ended strobe input.

7. An apparatus for measuring a repetitive signal as in claim 1 or 2 in which said SAR DAC is replaced by one or more integrators connected in series to form an undersampling delta modulator, the input of the integrator taking the value of +v or −v where v is equal to a fixed constant of integration, said SAR logic controlling the selection of +v or −v in accordance with said strobed comparator results.

8. An apparatus for measuring a repetitive signal as in claim 7 in which the output of said modulator is digitized by a prior art analog to digital converter to produce digitized samples, said samples being stored in said waveform capture memory.

* * * * *